US010276836B2

(12) United States Patent
Aziz et al.

(10) Patent No.: US 10,276,836 B2
(45) Date of Patent: Apr. 30, 2019

(54) METHOD OF MANUFACTURING ORGANIC EL ELEMENT

(71) Applicant: V Technology Co., Ltd., Yokohama-shi (JP)

(72) Inventors: Hany Maher Aziz, Ontario (CA);
Yoshitaka Kajiyama, Ontario (CA);
Koichi Kajiyama, Yokohama (JP);
Michinobu Mizumura, Yokohama (JP);
Yuya Fujimori, Yokohama (JP)

(73) Assignee: V. Technology Co., Ltd. (JP)

( * ) Notice: Subject to any disclaimer, the term of this patent is extended or adjusted under 35 U.S.C. 154(b) by 0 days.

(21) Appl. No.: 15/747,816

(22) PCT Filed: Jul. 8, 2016

(86) PCT No.: PCT/JP2016/070217
§ 371 (c)(1),
(2) Date: Jan. 26, 2018

(87) PCT Pub. No.: WO2017/022404
PCT Pub. Date: Feb. 9, 2017

(65) Prior Publication Data
US 2018/0233706 A1    Aug. 16, 2018

(30) Foreign Application Priority Data
Aug. 6, 2015   (JP) ................. 2015-156081

(51) Int. Cl.
*H01L 51/56* (2006.01)
*H01L 51/50* (2006.01)
(Continued)

(52) U.S. Cl.
CPC .......... *H01L 51/56* (2013.01); *H01L 27/3211* (2013.01); *H01L 27/3244* (2013.01);
(Continued)

(58) Field of Classification Search
CPC . H05B 33/10; H01L 27/3209; H01L 27/3211; H01L 51/002; H01L 51/0026;
(Continued)

(56) References Cited

U.S. PATENT DOCUMENTS 7,932,113 B1    4/2011  Yee et al.
8,383,193 B2 *  2/2013  Tanaka ................ H01L 51/0013
                                                        427/256
(Continued)

FOREIGN PATENT DOCUMENTS

CN    102054939 A    5/2011
CN    102456709 A    5/2012
(Continued)

OTHER PUBLICATIONS

First Office Action dated Jan. 28, 2019, of counterpart Chinese Application No. 201680037703.9, along with an English translation.

*Primary Examiner* — Stephen W Smoot
(74) *Attorney, Agent, or Firm* — DLA Piper LLP (US)

(57) ABSTRACT

A method of manufacturing an organic EL element includes forming a first electrode corresponding to a color of a constituent pixel on a substrate; forming a hole injection layer; forming a hole transport layer; forming a host material layer to cause a dopant material to diffuse on the side of the substrate on which the hole transport layer is formed; bringing the host material layer into contact with a dopant material side of a donor substrate in which the dopant material is formed on a metal layer; applying a current in a stacking direction between the first electrode corresponding to the pixel of the color corresponding to the dopant material and the metal layer; separating the donor substrate from the
(Continued)

substrate; and forming a second electrode on the side on which the host material layer in which the dopant material has diffused is formed.

13 Claims, 8 Drawing Sheets

(51) Int. Cl.
*H01L 51/00* (2006.01)
*H01L 27/32* (2006.01)
*H01L 51/52* (2006.01)

(52) U.S. Cl.
CPC ........ *H01L 51/003* (2013.01); *H01L 51/0013* (2013.01); *H01L 51/0026* (2013.01); *H01L 51/506* (2013.01); *H01L 51/5036* (2013.01); *H01L 51/5056* (2013.01); *H01L 51/5068* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5016* (2013.01); *H01L 2227/326* (2013.01); *H01L 2251/564* (2013.01)

(58) Field of Classification Search
CPC . H01L 51/003; H01L 51/5036; H01L 51/506; H01L 51/5068; H01L 51/5088; H01L 51/5092; H01L 51/56; H01L 2227/326; H01L 2251/564
See application file for complete search history.

(56) References Cited

U.S. PATENT DOCUMENTS

| | | |
|---|---|---|
| 9,093,647 B2 | 7/2015 | Park et al. |
| 2005/0214672 A1 | 9/2005 | Blanchet-Fincher |
| 2006/0188697 A1 | 8/2006 | Lee |
| 2009/0038550 A1 | 2/2009 | Higo |
| 2010/0291720 A1* | 11/2010 | Kim ................ H01L 27/3211 438/34 |
| 2012/0231228 A1* | 9/2012 | Fujimori ............ H01L 51/0013 428/172 |
| 2015/0017321 A1* | 1/2015 | Kudo ...................... H01M 4/00 427/77 |
| 2015/0155492 A1* | 6/2015 | Chin ................ H01L 51/0013 257/40 |

FOREIGN PATENT DOCUMENTS

| | | |
|---|---|---|
| JP | 2002-260856 A | 9/2002 |
| JP | 2003-092182 A | 3/2003 |
| JP | 2005-038784 A | 2/2005 |
| JP | 2007-173145 A | 7/2007 |
| JP | 2009-043572 A | 2/2009 |
| JP | 2010-192826 A | 9/2010 |
| JP | 2011-138745 A | 7/2011 |
| JP | 2011-221883 A | 11/2011 |
| JP | 2013-083704 A | 5/2013 |

* cited by examiner

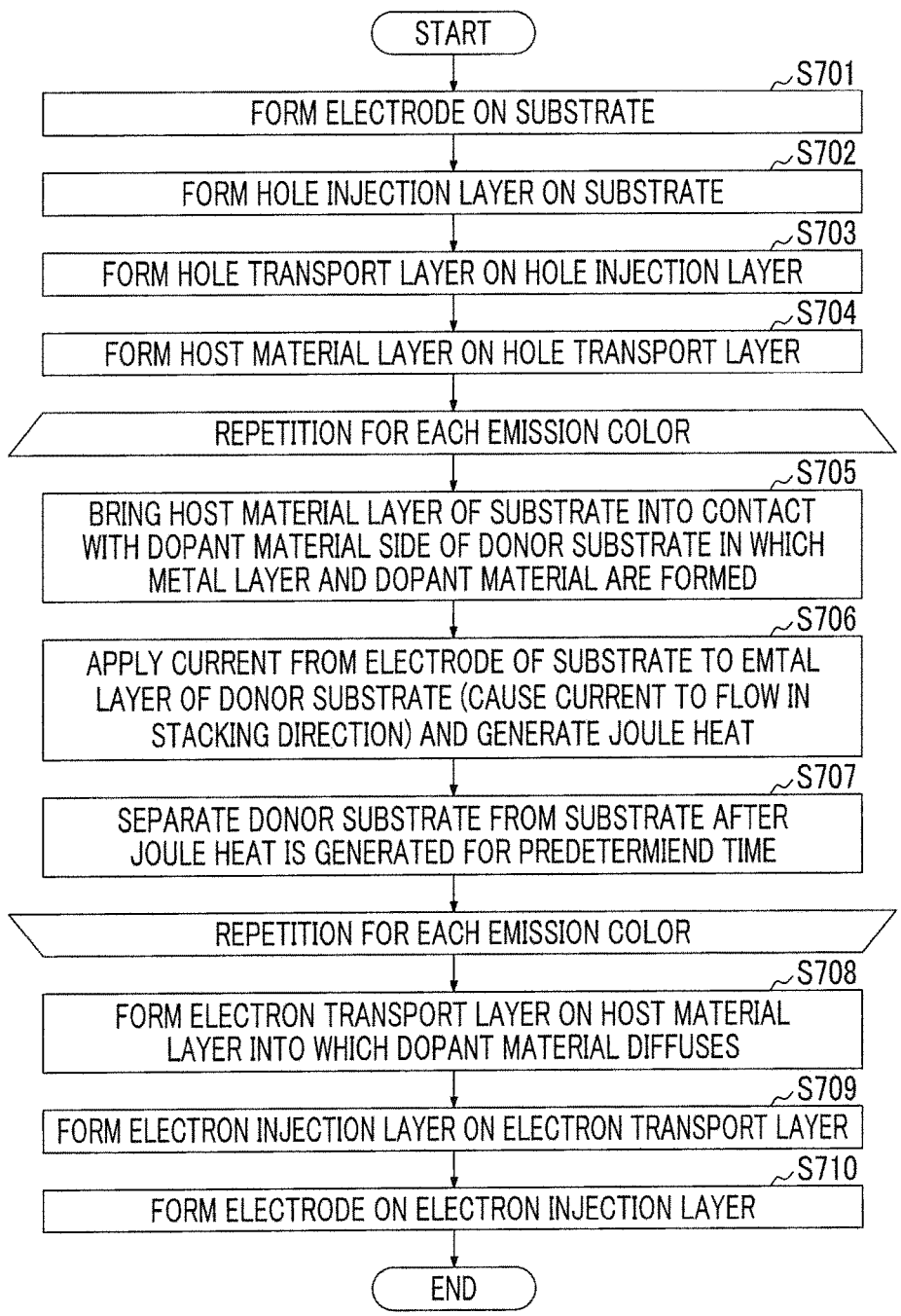

METHOD OF MANUFACTURING ORGANIC EL ELEMENT

TECHNICAL FIELD

This disclosure relates to a method of manufacturing an organic EL element.

BACKGROUND

When a vapor deposition method is used to manufacture an organic electroluminescence (EL) element, a hole injection layer, a hole transport layer, a dopant material, an electron transport layer, and an electron injection layer are formed on a substrate on which an electrode (a cathode) has been formed, and an electrode (an anode) is finally formed. In the course of forming the dopant material after the hole transport layer is formed, the dopant material is formed according to the colors of pixels.

At this time, in forming the dopant material, a method of forming the dopant material by vapor deposition using a fine metal mask (FMM) is generally often used. The dopant material can be formed at a desired position by the masking.

An example of the above-mentioned related art is disclosed in Japanese Unexamined Patent Application Publication No. 2013-083704.

When the masking is performed, it is preferable that the FMM be formed to be as thin as possible for the purpose of a decrease in size of the organic EL element and prevention of a shadow effect. However, when a mask material is decreased in thickness, the FMM is likely to be deformed. Because of the deformation, the shape of the dopant material deposited may be distorted and a light emitting layer may not be formed at a desired position. There is a problem in that FMM patterning accuracy will decrease as the size of the organic EL element decreases.

Therefore, it could be helpful to provide a method of manufacturing an organic EL element without performing masking.

SUMMARY

We thus provide:

A method of manufacturing an organic EL element including: forming a first electrode corresponding to a color of a constituent pixel on a substrate; forming a hole injection layer on the side of the substrate on which the first electrode is formed; forming a hole transport layer on the side of the substrate on which the hole injection layer is formed; forming a host material layer for causing a dopant material to diffuse on the side of the substrate on which the hole transport layer is formed; bringing the host material layer into contact with a dopant material side of a donor substrate in which the dopant material is formed on a metal layer; applying a current in a stacking direction between the electrode corresponding to the pixel of the color corresponding to the dopant material and the metal layer; separating the donor substrate from the substrate; and forming a second electrode on the side on which the host material layer in which the dopant material has diffused is formed.

In the method of manufacturing an organic EL element, Joule heat can be generated between the first electrode and the second electrode by causing a current to flow in the stacking direction. Accordingly, it is possible to cause the dopant material to diffuse to a position corresponding to an appropriate electrode of a color in the host material layer using the Joule heat without performing masking.

BRIEF DESCRIPTION OF THE DRAWINGS

FIG. 7 is a flowchart illustrating a method of manufacturing an organic EL element.

REFERENCE NUMBERS

Figure 1A:
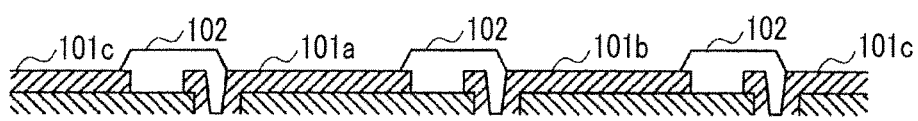
FIGS. 1A to 1C are sectional views of an organic EL element illustrating a process of manufacturing an organic EL element.

Start
S701 FORM ELECTRODE ON SUBSTRATE
S702 FORM HOLE INJECTION LAYER ON SUBSTRATE
S703 FORM HOLE TRANSPORT LAYER ON HOLE INJECTION LAYER
S704 FORM HOST MATERIAL LAYER ON HOLE TRANSPORT LAYER REPEAT FOR EACH EMISSION COLOR
S705 BRING HOST MATERIAL LAYER OF SUBSTRATE INTO CONTACT WITH DOPANT MATERIAL SIDE OF DONOR SUBSTRATE IN WHICH METAL LAYER AND DOPANT MATERIAL ARE FORMED
S706 APPLY CURRENT FROM ELECTRODE OF SUBSTRATE TO METAL LAYER OF DONOR SUBSTRATE (CAUSE CURRENT TO FLOW IN STACKING DIRECTION) AND GENERATE JOULE HEAT
S707 SEPARATE DONOR SUBSTRATE FROM SUBSTRATE AFTER JOULE HEAT IS GENERATED FOR PREDETERMINED TIME REPEAT FOR EACH EMISSION COLOR
S708 FORM ELECTRON TRANSPORT LAYER ON HOST MATERIAL LAYER INTO WHICH DOPANT MATERIAL DIFFUSES
S709 FORM ELECTRON INJECTION LAYER ON ELECTRON TRANSPORT LAYER
S710 FORM ELECTRODE ON ELECTRON INJECTION LAYER
End

DETAILED DESCRIPTION

As a method of forming a dopant material which is a light emitting layer on a substrate without using the masking, a method of causing the dopant material to diffuse into a host material layer stacked on a hole transport layer using heat is known. In that method, the dopant material diffuses from a contact surface to the host material layer when the dopant material is brought into contact with the host material layer and the substrate is heated in that state (for example, Japanese Unexamined Patent Application Publication No. 2005-038784).

Since a diffusion area can be defined by defining a contact area of the dopant material using the method and a mask material is not used, distortion of the dopant material formed on the substrate due to deformation of a mask does not occur.

On the other hand, when that method is used, the dopant material diffuses from the contact surface into the host material layer and it is thus necessary to form the dopant material to come in contact with only a position at which the dopant material should be formed. However, a troublesome amount of effort is required to form the dopant material to cause only a position at which the dopant material should come in contact with the host material layer to protrude.

In this regard, a method of forming a wire at a position into which the dopant material should diffuse on the substrate and causing a current to flow to that position to generate Joule heat such that heat is generated at a desired position is known (for example, Japanese Unexamined Patent Application Publication No. 2002-260856). However, that method causes formation of a wire which is not necessary when an organic EL element functions and causes an increase in cost.

However, we discovered a method of generating heat at a desired position on a substrate to cause a dopant material to diffuse without forming a new wire on the substrate. That method will thus be described below in detail.

FIGS. 1 to 6 are sectional views of an organic EL element illustrating a process of manufacturing the organic EL element. FIG. 7 is a flowchart illustrating a method of manufacturing an organic EL element. Hereinafter, the method of manufacturing an organic EL element will be described with reference to the flowchart illustrated in FIG. 7 and with appropriate reference to FIGS. 1 to 6.

As illustrated in FIG. 7, first, a red light emitting layer electrode 101a, a green light emitting layer electrode 101b, a blue light emitting layer electrode 101c, and a partition wall 102 are formed on a glass substrate (Step S701). Accordingly, a thin film transistor (TFT) substrate is constituted (see FIG. 1A).

Figure 1B:
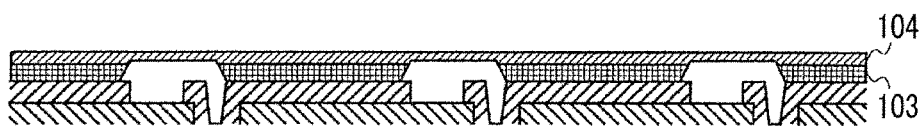

As illustrated in FIG. 1B, a hole injection layer 103 is formed on the constituted TFT substrate (Step S702). The hole injection layer 103 is formed of copper phthalocyanine (CuPC) or the like, and the thickness thereof preferably ranges, for example, from 1 nm to 100 nm and more preferably ranges from 1 nm to 20 nm.

Then, as illustrated in FIG. 1B, a hole transport layer 104 is formed on the TFT substrate on which the hole injection layer 103 has been formed (Step S703). The hole transport layer 104 is formed of, for example, 2-tert-butyl-4(dicyanomethylene)-6-[2-(1,1,7,7-tetramethyl-julolidine-9-yl)vinyl]-4H-pyran (hereinafter referred to as DCJTB) or 2-phenyl-9,10-di(naphthaene-2-yl)-anthracene (hereinafter referred to as C545T) and the thickness thereof preferably ranges, for example, from 1 nm to 100 nm and more preferably ranges from 1 nm to 20 nm.

Figure 1C:
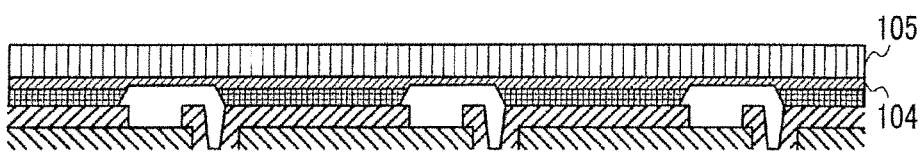

Then, as illustrated in FIG. 1C, a host material layer 105 is formed on the hole transport layer 104 (Step S704). The host material layer 105 is a layer causing the dopant material to diffuse and invade thereinto by heat and is formed of N,N'-bis(naphthalene-1-yl)-N,N'-bis(phenyl)-benzidine (NPB), tris(8-quinolinato)aluminum (Alq3), 2-tert-butyl-9,10-di(naphtha-2-yl)anthracene (TBADN), [4,4'-bis(carbazol-9-yl)biphenyl] (CBP), or the like, and the thickness thereof preferably ranges, for example, from 1 nm to 100 nm and more preferably ranges from 1 nm to 20 nm.

Then, the processes of Steps S705 to S707 are performed for each emission color. It is assumed that light emitting layers of three colors including red, green, and blue are formed.

First, a red light emitting layer donor substrate 200a is prepared. The red light emitting layer donor substrate 200a is formed by forming a metal layer 202 on a substrate 201 and stacking a red light emitting layer dopant material layer 203a thereon.

The substrate 201 is formed of, for example, silicon or glass.

The metal layer 202 is preferably formed of a metal with high conductivity and a high carrier injection property and is formed of, for example, aluminum (Al), silver (Ag), or an aluminum-silver alloy (Al:Ag).

The red light emitting layer dopant material layer 203a is formed of, for example, DCJTB or platinum octaethylporphyrin (PtOEP).

Figure 2A:
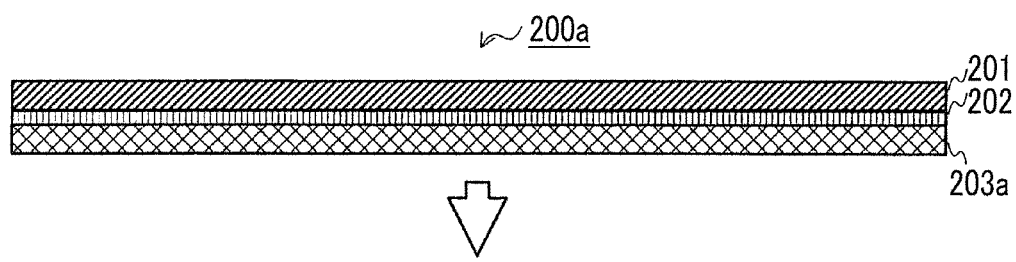
FIGS. 2A to 2C are sectional views of the organic EL element illustrating the process of manufacturing an organic EL element.
Figure 2B:
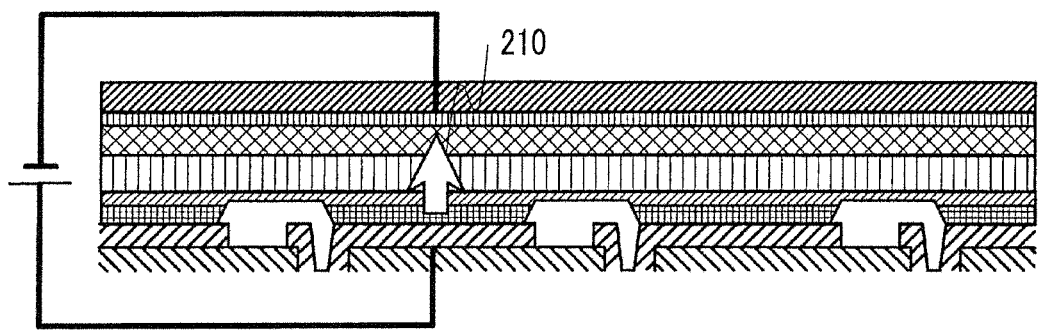

As illustrated in FIG. 2A, the red light emitting layer donor substrate 200a is brought into contact with the TFT substrate on which the host material layer 105 has been formed (Step S705).

A voltage is applied across the red light emitting layer electrode 101a corresponding to a red light emitting layer and the metal layer 202 of the red light emitting layer donor substrate 200a. Accordingly, as indicated by an arrow 210 in FIG. 2B, a current is applied (flows) from the red light emitting layer electrode 101a to the metal layer 202. That is, a current flows in the stacking direction of the organic EL element.

Figure 2C:
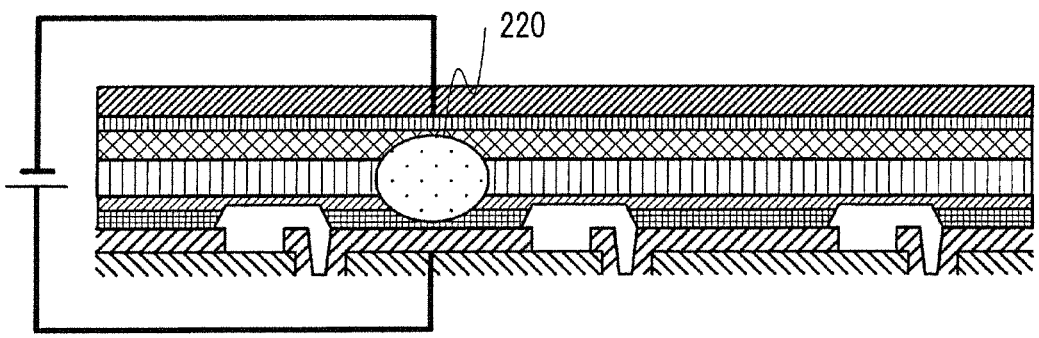

By causing a current to flow between the red light emitting layer electrode 101a and the metal layer 202, Joule heat centered on an area indicated by a circle 220 in FIG. 2C is generated (Step S706). To form a red light emitting layer, the temperature due to the Joule heat ranges from 70° C. to 140° C. and preferably ranges from 80° C. to 100° C.

Figure 3A:
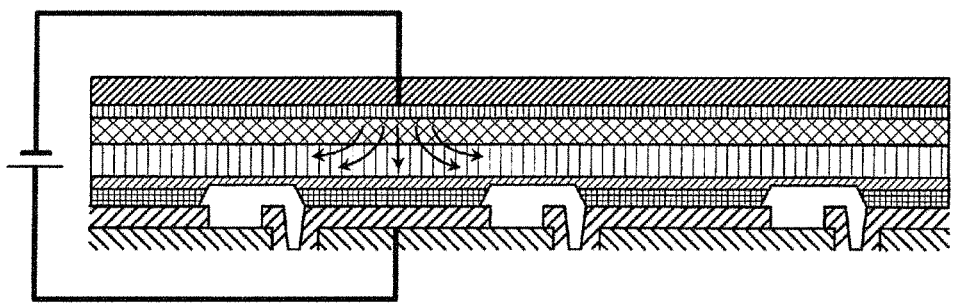
FIGS. 3A to 3C are sectional views of the organic EL element illustrating the process of manufacturing an organic EL element.
Figure 3B:
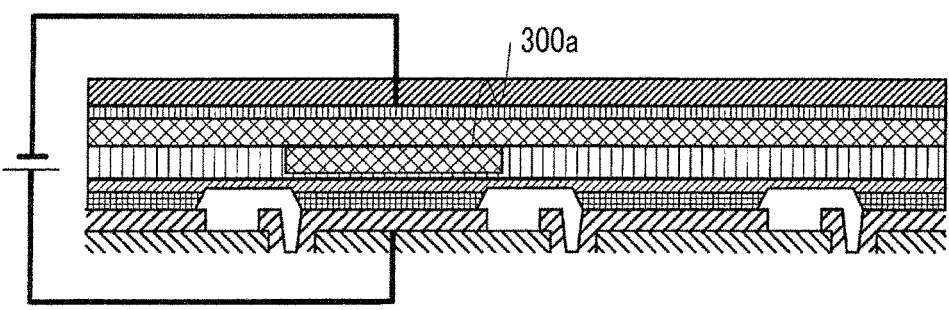
Figure 3C:
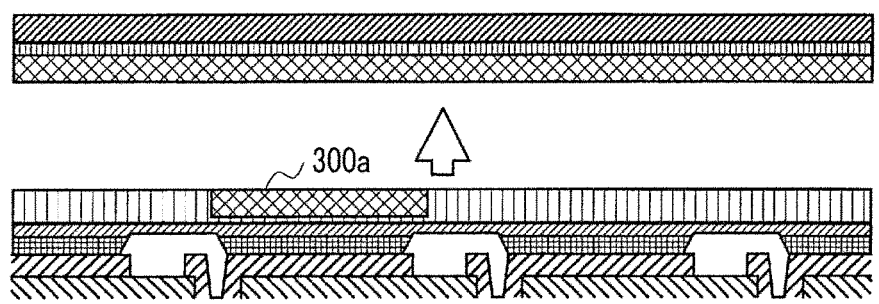

Then, as illustrated in FIG. 3A, the dopant material for the red light emitting layer diffuses from the red light emitting layer dopant material layer 203a of the red light emitting layer donor substrate 200a into the host material layer 105. The dopant material diffuses into an area having heat of a predetermined temperature or higher, and a red light emitting layer 300a centered on the area in which the current flows is formed as illustrated in FIG. 3B.

After the current flows for a predetermined time to generate sufficient Joule heat, supply of the current stops. Then, when the substrate reaches a normal temperature, the red light emitting layer donor substrate 200a is separated from the TFT substrate.

Figure 4A:
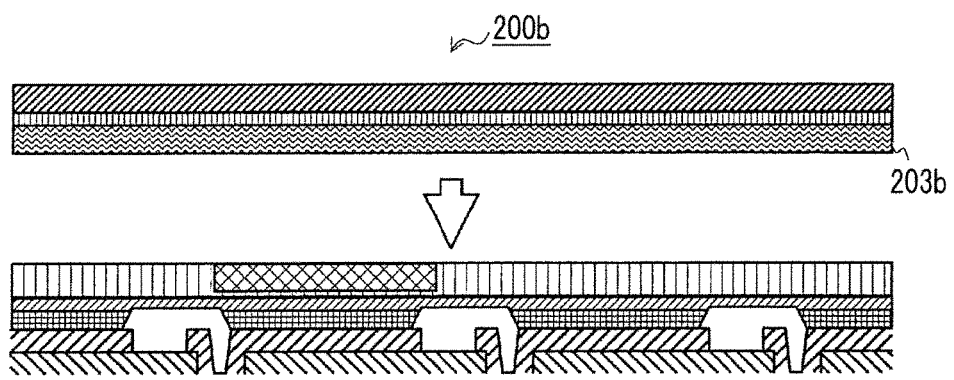
FIGS. 4A to 4C are sectional views of the organic EL element illustrating the process of manufacturing an organic EL element.

Then, a donor substrate for another emission color is prepared. A green light emitting layer donor substrate 200b is prepared. As illustrated in FIG. 4A, the green light emitting layer donor substrate 200b is formed by forming a green light emitting layer dopant material layer 203b on a metal layer 202 formed on a substrate 201.

The green light emitting layer donor substrate 200b is brought into contact with the TFT substrate on which the red light emitting layer 300a is formed such that the host material layer 105 of the TFT substrate faces the green light emitting layer dopant material layer 203b of the green light emitting layer donor substrate 200b (Step S705). The green light emitting layer dopant material layer 203b is formed of, for example, C545T or tri(2-phenylpyridinato)iridium(III) (hereinafter referred to as Ir(ppy)$_3$).

Figure 4B:
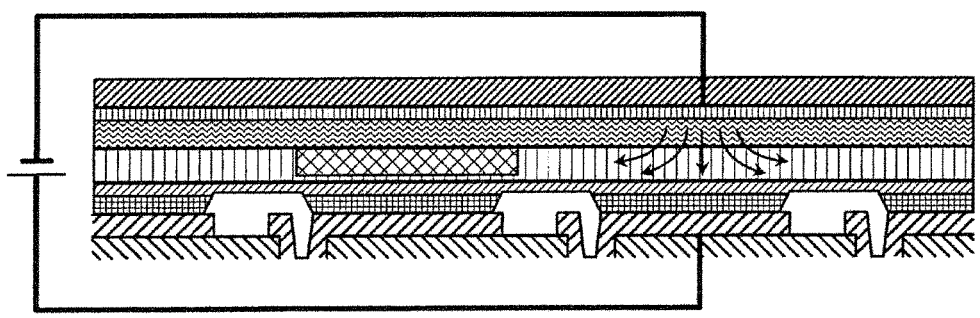

Then, as illustrated in FIG. 4B, a current is made to flow from the green light emitting layer electrode 101b to the metal layer 202 of the green light emitting layer donor substrate 200b to generate Joule heat (Step S706). Accordingly, a green light emitting layer dopant material diffuses into the host material layer 105. Joule heat generated for diffusion of the green light emitting layer dopant material ranges from 70° C. to 140° C. and preferably ranges from 80° C. to 100° C.

Figure 4C:
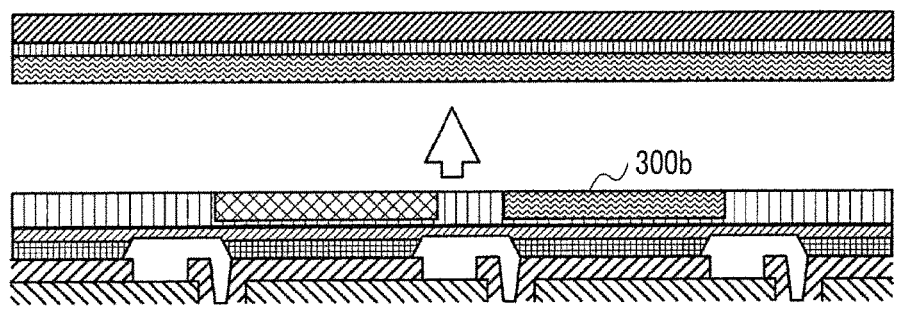

After the green light emitting layer dopant material diffuses, the green light emitting layer donor substrate 200b is separated from the TFT substrate on which the green light emitting layer 300b is formed as illustrated in FIG. 4C (Step S707).

Figure 5A:
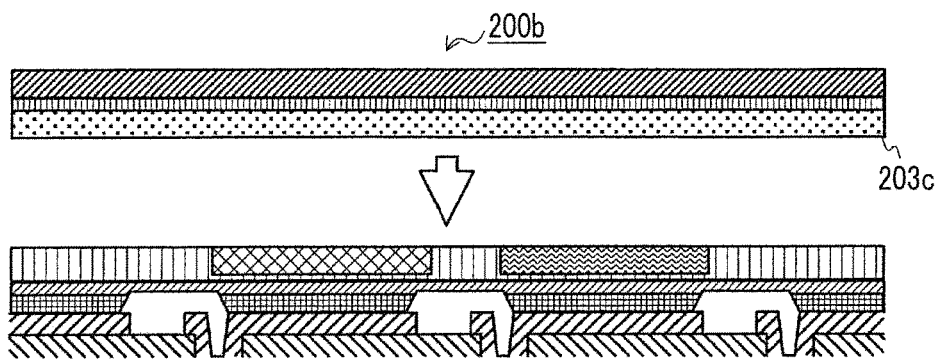
FIGS. 5A to 5C are sectional views of the organic EL element illustrating the process of manufacturing an organic EL element.

Finally, as illustrated in FIG. 5A, a blue light emitting layer donor substrate 200c is brought into contact with the TFT substrate. The blue light emitting layer donor substrate 200c includes a blue light emitting layer dopant material layer 203c on a metal layer 202 as a dopant material. The blue light emitting layer donor substrate 200c is brought into contact with the TFT substrate such that the blue light emitting layer dopant material layer 203c faces the host material layer 105 of the TFT substrate (Step S705). The blue light emitting layer dopant material layer 203c is formed of, for example, distilarylene (DSA) or bis(3,5-difluoro-2-(2-pyridylphenyl)phenyl-(2-carboxypyridyl)iridiumIII(FIrPic).

Figure 5B:
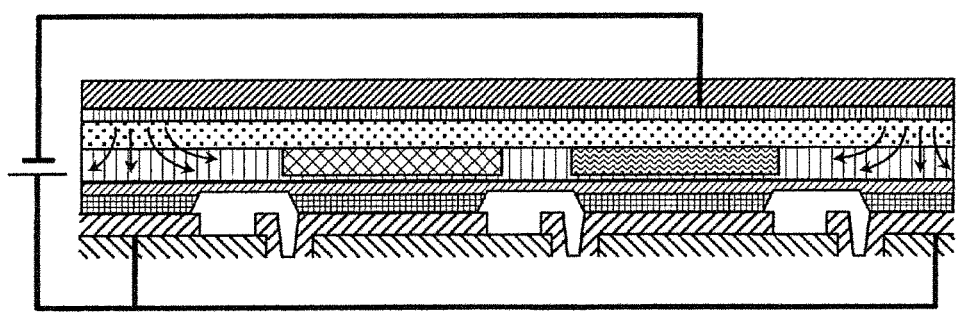

As illustrated in FIG. 5B, after the blue light emitting layer donor substrate 200c is brought into contact with the TFT substrate, a current is made to flow from the blue light emitting layer electrode 101c to the metal layer 202 of the blue light emitting layer donor substrate 200c. Accordingly, Joule heat centered on a position at which the current flows is generated, and a blue light emitting layer dopant material diffuses into the host material layer 105 (Step S706). The Joule heat which is generated for diffusion of the blue light emitting layer dopant material ranges from 70° C. to 140° C. and preferably ranges from 80° C. to 100° C.

Figure 5C:
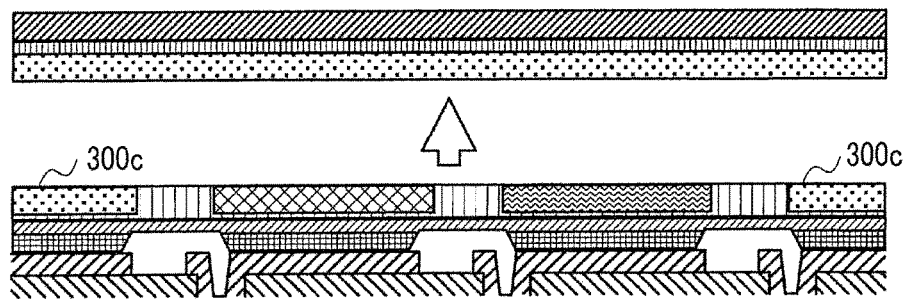

Then, as illustrated in FIG. 5C, the blue light emitting layer dopant material diffuses into the host material layer 105 due to the Joule heat, and the blue light emitting layer donor substrate 200c is separated from the TFT substrate on which the blue light emitting layer 300c is formed (Step S707).

Accordingly, light emitting layers of three colors including red, green, and blue are formed on the TFT substrate.

Figure 6A:
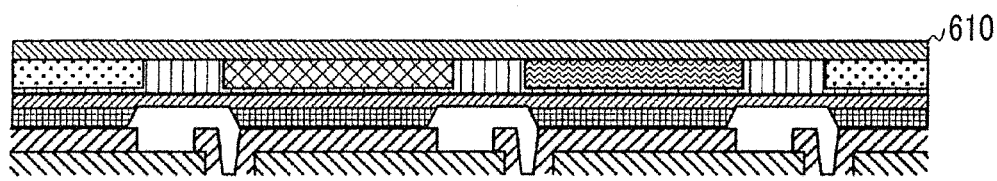
FIGS. 6A to 6C are sectional views of the organic EL element illustrating the process of manufacturing an organic EL element.

Then, as illustrated in FIG. 6A, an electron transport layer 610 is formed on the host material layer 105 into which the dopant material has diffused (Step S708).

Figure 6B:
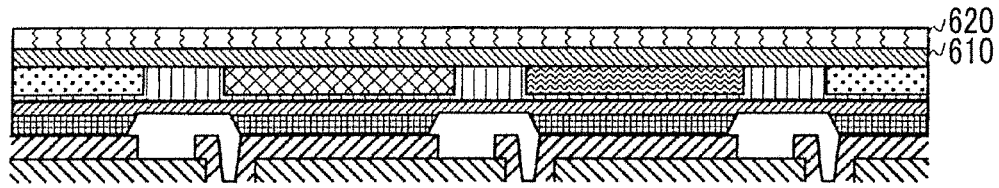

When the electron transport layer 610 is formed, an electron injection layer 620 is formed on the electron transport layer 610 as illustrated in FIG. 6B (Step S709).

Figure 6C:
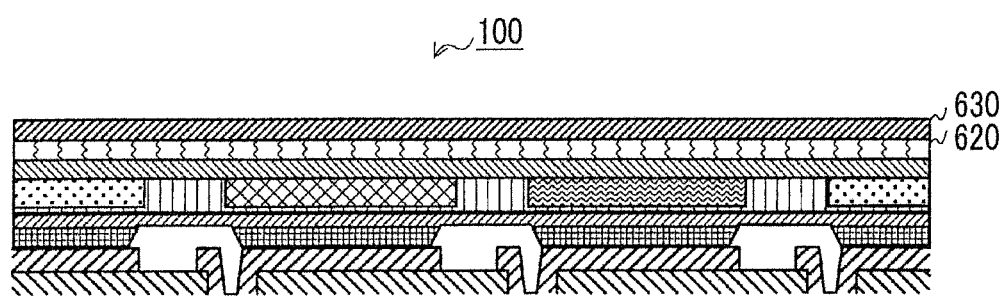

When the electron injection layer 620 is formed, an electrode 630 is formed on the electron injection layer as illustrated in FIG. 6C (Step S710).

An organic EL element 100 is manufactured through the manufacturing process illustrated in FIG. 7.

As described above in the example, in the method of manufacturing an organic EL element according to this example, by causing a current to flow in the stacking direction of layers of the organic EL element from the electrode originally used for emission of light in the organic EL element, it is possible to generate Joule heat and cause the dopant materials in contact to diffuse. Accordingly, with our method of manufacturing an organic EL element, it is possible to avoid the labor of forming an extra electrode on a substrate and an associated increase in cost by using the electrode which is used for emission of light. By using the electrodes which are formed for the light emitting layers and causing a current to flow from the electrodes, Joule heat can be generated at appropriate positions to cause the dopant material to diffuse into necessary positions and thus it is not necessary to perform masking.

MODIFIED EXAMPLES

While an example has been described above, the concept of our method in this disclosure is not limited to the example. Various modified examples which are included in the concept will be described below.

(1) In the above-mentioned example, the light emitting layers of three colors including RGB are formed, but the emission colors of the light emitting layers are not limited thereto. A light emitting layer of another color can be included and, for example, a white light emitting layer may be formed.

(2) In the above-mentioned example, the red light emitting layer donor substrate 200a has a configuration in which the metal layer 202 is formed on the substrate 201 and the red light emitting layer dopant material layer 203a is formed thereon.

Figure 8:
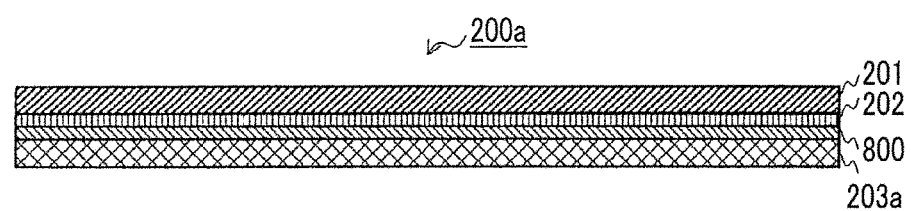
FIG. 8 is a sectional view of a donor substrate illustrating another example of a configuration of the donor substrate.

As illustrated in FIG. 8, the red light emitting layer donor substrate 200a may have a configuration in which a carrier injection layer (an electron injection layer) is formed between the metal layer 202 and the red light emitting layer dopant material layer 203a. The carrier injection layer is formed of, for example, lithium fluoride (hereinafter referred to as LiF).

By forming the red light emitting layer donor substrate 200a to have the above-mentioned configuration, a current can easily flow from the red light emitting layer electrode 101a to the metal layer 202 and Joule heat can be easily generated. The green light emitting layer donor substrate 200b and the blue light emitting layer donor substrate 200c may have the same configuration.

Figure 9:
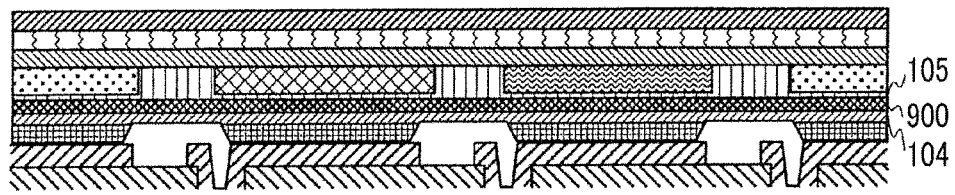
FIG. 9 is a sectional view of an organic EL element illustrating another example of a configuration of the organic EL element.

(3) Although not particularly described in the above-mentioned example, a step of forming a diffusion prevention layer 900 between the hole transport layer 104 and the host material layer 105 may be included in the method of manufacturing an organic EL element as illustrated in FIG. 9. The diffusion prevention layer 900 is formed of, for example, molybdenum oxide (hereinafter referred to as MoO$_3$). The thickness of the diffusion prevention layer 900 preferably ranges from 5 nm to 50 nm.

When the diffusion prevention layer 900 is formed, a step of heating the substrate as a whole may be provided after the light emitting layers of all colors are formed or whenever the light emitting layer of each color is formed in the host material layer 105. Accordingly, diffusion of the dopant material which may not be sufficient with only the Joule heat can be performed on a necessary position of the host material layer by reheating without diffusion into the hole transport layer 104.

(4) In the above-mentioned example, the red light emitting layer, the green light emitting layer, and the blue light emitting layer are formed in that order, but the order is not limited thereto. The light emitting layers may be formed in another order, and may be formed in the order of the green light emitting layer, the red light emitting layer, and the blue light emitting layer. The order is preferably set to an order in which the difficulty in thermal diffusion of the dopant materials of the colors decreases.

(5) In the above-mentioned example, Steps S708 and S709 are not essential steps. If electrodes are formed without performing these steps, the organic EL element will emit light, but luminous efficiency thereof will decrease.

Supplements

An aspect of the method of manufacturing an organic EL element and advantageous effects thereof will be described below.

(a) Our method of manufacturing an organic EL element may include: a first electrode forming step of forming a first electrode corresponding to a color of a constituent pixel on a substrate; a hole injection layer forming step of forming a hole injection layer on the side of the substrate on which the first electrode is formed; a hole transport layer forming step of forming a hole transport layer on the side of the substrate on which the hole injection layer is formed; a host material layer forming step of forming a host material layer for causing a dopant material to diffuse on the side of the substrate on which the hole transport layer is formed; a contact step of bringing the host material layer into contact with a dopant material side of a donor substrate in which the dopant material is formed on a metal layer; a current applying step of applying a current in a stacking direction between the electrode corresponding to the pixel of the color corresponding to the dopant material and the metal layer; a separation step of separating the donor substrate from the substrate; and a second electrode forming step of forming a second electrode on the side on which the host material layer in which the dopant material has diffused is formed.

Accordingly, in the method of manufacturing an organic EL element, Joule heat can be generated between the first electrode and the second electrode by causing a current to flow in the stacking direction. Accordingly, it is possible to cause the dopant material to diffuse to a position corresponding to an appropriate electrode of a color in the host material layer using the Joule heat without performing masking. Since the Joule heat can be generated using an electrode which is used as a light emitting element at the time of applying the current, it is not necessary to provide a new electrode for generating Joule heat on a substrate side.

(b) In the method of manufacturing an organic EL element according to (a), the donor substrate may include an electron injection layer between the metal layer and the dopant material.

Accordingly, a current for generating Joule heat for causing the dopant material to diffuse into the host material layer can be caused to flow more easily compared when the electron injection layer is not formed. Accordingly, it is possible to achieve an increase in efficiency in manufacturing an organic EL element.

(c) The method of manufacturing an organic EL element according to (a) or (b) may further include, between the separation step and the second electrode forming step: an electron transport layer forming step of forming an electron transport layer on the host material layer side of the substrate; and an electron injection layer forming step of forming an electron injection layer on the side of the substrate on which the electron transport layer is formed.

Accordingly, since a current can be made to easily flow by forming the electron injection layer and the electron transport layer on the substrate, it is possible to improve luminous efficiency of the organic EL element which is manufactured.

(d) The method of manufacturing an organic EL element according to any one of (a) to (c) may further include a diffusion prevention layer forming step of forming a diffusion prevention layer for preventing the dopant material from diffusing into the hole transport layer on the side of the substrate on which the hole transport layer is formed between the hole transport layer forming step and the host material layer forming step.

Accordingly, when Joule heat is generated to cause the dopant material to diffuse into the host material layer, it is possible to prevent the dopant material from diffusing into the hole transport layer.

(e) The method of manufacturing an organic EL element according to (d) may further include a heating step of heating the substrate after the second electrode is formed.

Accordingly, the dopant material can be made to uniformly diffuse to a position at which diffusion is not sufficient with only the Joule heat. In this case, it is also possible to prevent the dopant material from diffusing into the hole transport layer by the diffusion prevention layer.

In the method of manufacturing an organic EL element according to any one of (a) to (e), the contact step, the current applying step, and the separation step may be performed for each donor substrate corresponding to an emission color.

Accordingly, it is possible to manufacture an organic EL element which is a light emitting element in which a light emitting layers corresponding to colors such as the three colors red, green, and blue, and white are formed.

What is claimed is:

1. A method of manufacturing an organic EL element comprising:
    forming a first electrode corresponding to a color of a constituent pixel on a substrate;
    forming a hole injection layer on a side of the substrate on which the first electrode is formed;
    forming a hole transport layer on the side of the substrate on which the hole injection layer is formed;
    forming a host material layer to cause a dopant material to diffuse on the side of the substrate on which the hole transport layer is formed;
    bringing the host material layer into contact with a dopant material side of a donor substrate in which the dopant material is formed on a metal layer;
    applying a current in a stacking direction between the first electrode corresponding to the pixel of the color corresponding to the dopant material and the metal layer;
    separating the donor substrate from the substrate; and
    forming a second electrode on the side on which the host material layer in which the dopant material has diffused is formed.

2. The method according to claim 1, wherein the donor substrate includes a carrier injection layer between the metal layer and the dopant material.

3. The method according to claim 2, further comprising: between the separating of the donor substrate and the forming of the second electrode,
    forming an electron transport layer on the host material layer side of the substrate; and
    forming an electron injection layer on the side of the substrate on which the electron transport layer is formed.

4. The method according to claim 2, further comprising forming a diffusion prevention layer to prevent the dopant material from diffusing into the hole transport layer on the side of the substrate on which the hole transport layer is formed between the hole transport layer forming step and the host material layer forming step.

5. The method according to claim 2, wherein the bringing of the host material layer into contact, the applying of the current, and the separating of the donor substrate form a light emitting layer having different emission colors corresponding to the color of the constituent pixel, and the bringing of the host material layer into contact, the applying of the current, and the separating of the donor substrate are performed for donor substrate corresponding to the different emission colors.

6. The method according to claim 1, further comprising: between the separating of the donor substrate and the forming of the second electrode,
 forming an electron transport layer on the host material layer side of the substrate; and
 forming an electron injection layer on the side of the substrate on which the electron transport layer is formed.

7. The method according to claim 6, further comprising forming a diffusion prevention layer to prevent the dopant material from diffusing into the hole transport layer on the side of the substrate on which the hole transport layer is formed between the hole transport layer forming step and the host material layer forming step.

8. The method according to claim 6, wherein the bringing of the host material layer into contact, the applying of the current, and the separating of the donor substrate form a light emitting layer having different emission colors corresponding to the color of the constituent pixel, and the bringing of the host material layer into contact, the applying of the current, and the separating of the donor substrate are performed for donor substrate corresponding to the different emission colors.

9. The method according to claim 1, further comprising forming a diffusion prevention layer to prevent the dopant material from diffusing into the hole transport layer on the side of the substrate on which the hole transport layer is formed between the hole transport layer forming step and the host material layer forming step.

10. The method according to claim 9, further comprising heating the substrate after the second electrode is formed.

11. The method according to claim 10, wherein the bringing of the host material layer into contact, the applying of the current, and the separating of the donor substrate form a light emitting layer having different emission colors corresponding to the color of the constituent pixel, and the bringing of the host material layer into contact, the applying of the current, and the separating of the donor substrate are performed for donor substrate corresponding to the different emission colors.

12. The method according to claim 9, wherein the bringing of the host material layer into contact, the applying of the current, and the separating of the donor substrate form a light emitting layer having different emission colors corresponding to the color of the constituent pixel, and the bringing of the host material layer into contact, the applying of the current, and the separating of the donor substrate are performed for donor substrate corresponding to the different emission colors.

13. The method according to claim 1, wherein the bringing of the host material layer into contact, the applying of the current, and the separating of the donor substrate form a light emitting layer having different emission colors corresponding to the color of the constituent pixel, and the bringing of the host material layer into contact, the applying of the current, and the separating of the donor substrate are performed for donor substrate corresponding to the different emission colors.

* * * * *